US009355816B2

(12) United States Patent
Ookawa et al.

(10) Patent No.: US 9,355,816 B2
(45) Date of Patent: May 31, 2016

(54) PROGRAM FOR CORRECTING CHARGED PARTICLE RADIATION LOCATION, DEVICE FOR CALCULATING DEGREE OF CORRECTION OF CHARGED PARTICLE RADIATION LOCATION, CHARGED PARTICLE RADIATION SYSTEM, AND METHOD FOR CORRECTING CHARGED PARTICLE RADIATION LOCATION

(71) Applicant: Dai Nippon Printing Co., Ltd., Tokyo (JP)

(72) Inventors: Yohei Ookawa, Tokyo (JP); Hidenori Ozawa, Tokyo (JP)

(73) Assignee: DAI NIPPONI PRINTING CO., LTD., Tokyo (JP)

( * ) Notice: Subject to any disclaimer, the term of this patent is extended or adjusted under 35 U.S.C. 154(b) by 0 days.

(21) Appl. No.: 14/773,233

(22) PCT Filed: Jan. 22, 2014

(86) PCT No.: PCT/JP2014/051308
§ 371 (c)(1),
(2) Date: Sep. 4, 2015

(87) PCT Pub. No.: WO2014/148096
PCT Pub. Date: Sep. 25, 2014

(65) Prior Publication Data
US 2016/0027611 A1    Jan. 28, 2016

(30) Foreign Application Priority Data
Mar. 18, 2013   (JP) .................................. 2013-055276

(51) Int. Cl.
*H01J 37/00* (2006.01)
*H01J 37/304* (2006.01)
*H01J 37/317* (2006.01)
*H01J 37/20* (2006.01)

(52) U.S. Cl.
CPC ............. *H01J 37/3045* (2013.01); *H01J 37/20* (2013.01); *H01J 37/3174* (2013.01); *H01J 2237/30455* (2013.01)

(58) Field of Classification Search
CPC ... H01J 37/3045; H01J 37/3174; H01J 37/20; H01J 2237/30455
USPC ............................................ 250/492.1–492.3
See application file for complete search history.

(56) References Cited

U.S. PATENT DOCUMENTS

| 2008/0067441 A1* | 3/2008 | Wake ..................... | B82Y 10/00 250/492.21 |
| 2009/0179161 A1* | 7/2009 | Ward ..................... | B82Y 10/00 250/492.21 |
| 2009/0242787 A1 | 10/2009 | Nakayamada et al. | |

FOREIGN PATENT DOCUMENTS

| JP | 2003-187175 A | 7/2003 |
| JP | 2007-324175 A | 12/2007 |
| JP | 2009-260250 A | 11/2009 |

OTHER PUBLICATIONS

International Search Report for PCT/JP2014/051308 dated Apr. 28, 2014.

*Primary Examiner* — Michael Maskell
(74) *Attorney, Agent, or Firm* — Locke Lord LLP

(57) ABSTRACT

The present invention provides a non-transitory medium storing a program for correcting an irradiation position of a charged particle beam, a correction amount calculation device, a charged particle beam irradiation system, and a method for correcting an irradiation position of a charged particle beam. The medium includes instructions for causing a control unit to perform actions including replacing charging of a resist with surface charges at an interface between the resist and a work piece, and calculating a charge density distribution of the surface charges; calculating a trajectory of a charged particle based on the charge density distribution; calculating an amount of error of the irradiation position of the charged particle beam based on the trajectory and calculating an amount of correction of the irradiation position of the charged particle beam based on the error amount.

18 Claims, 8 Drawing Sheets

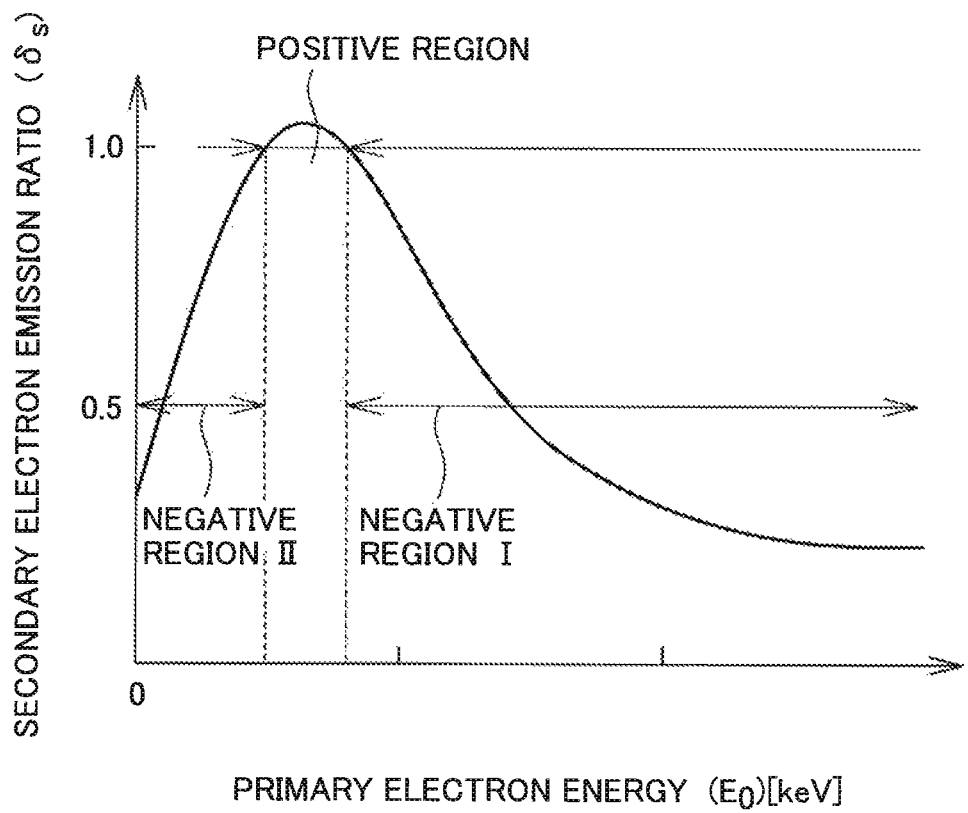

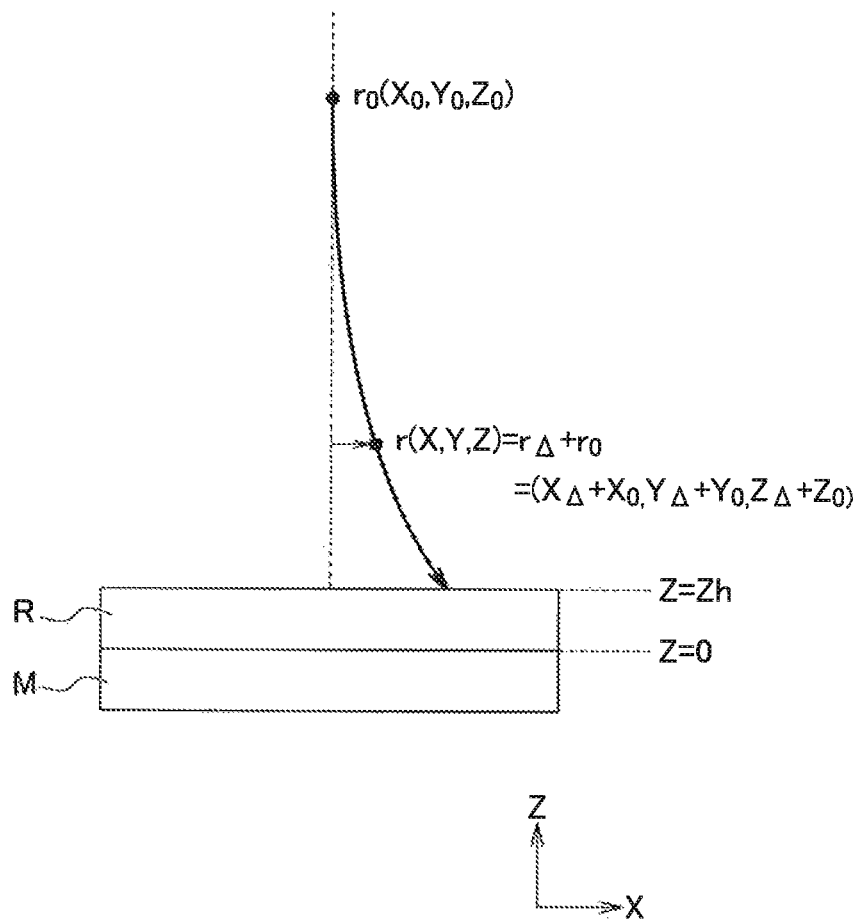

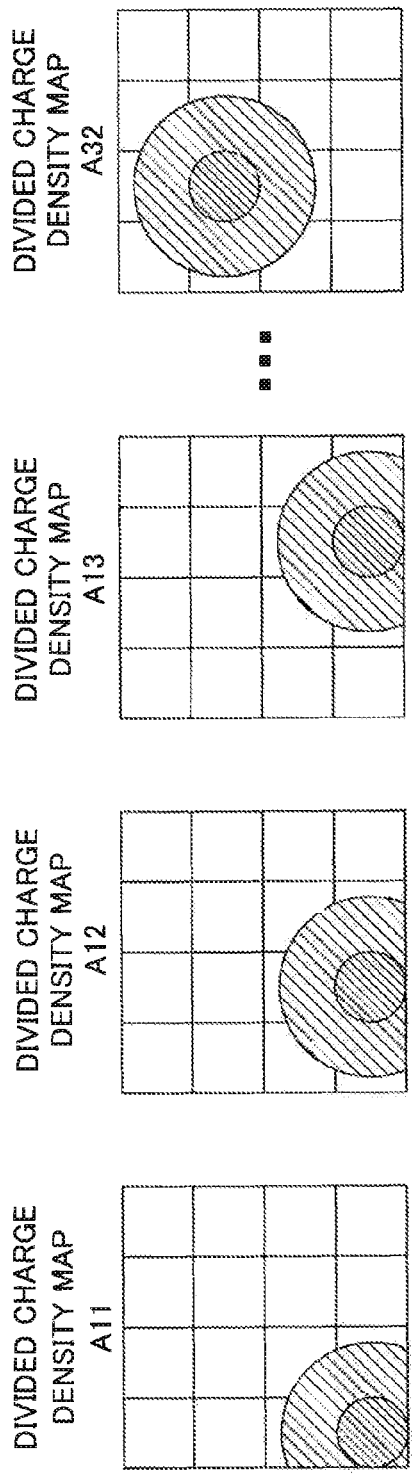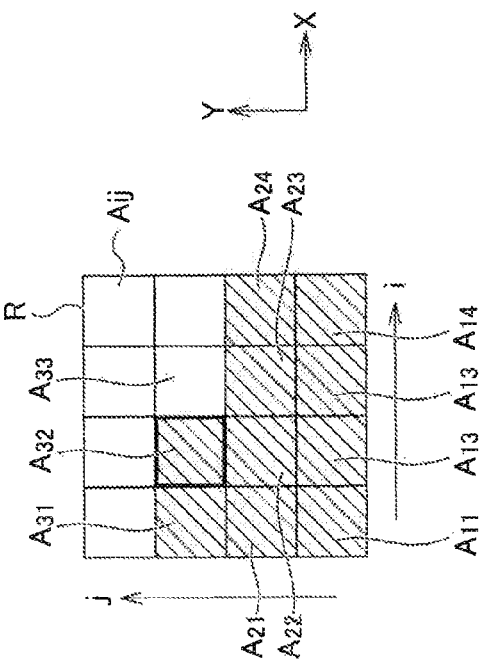

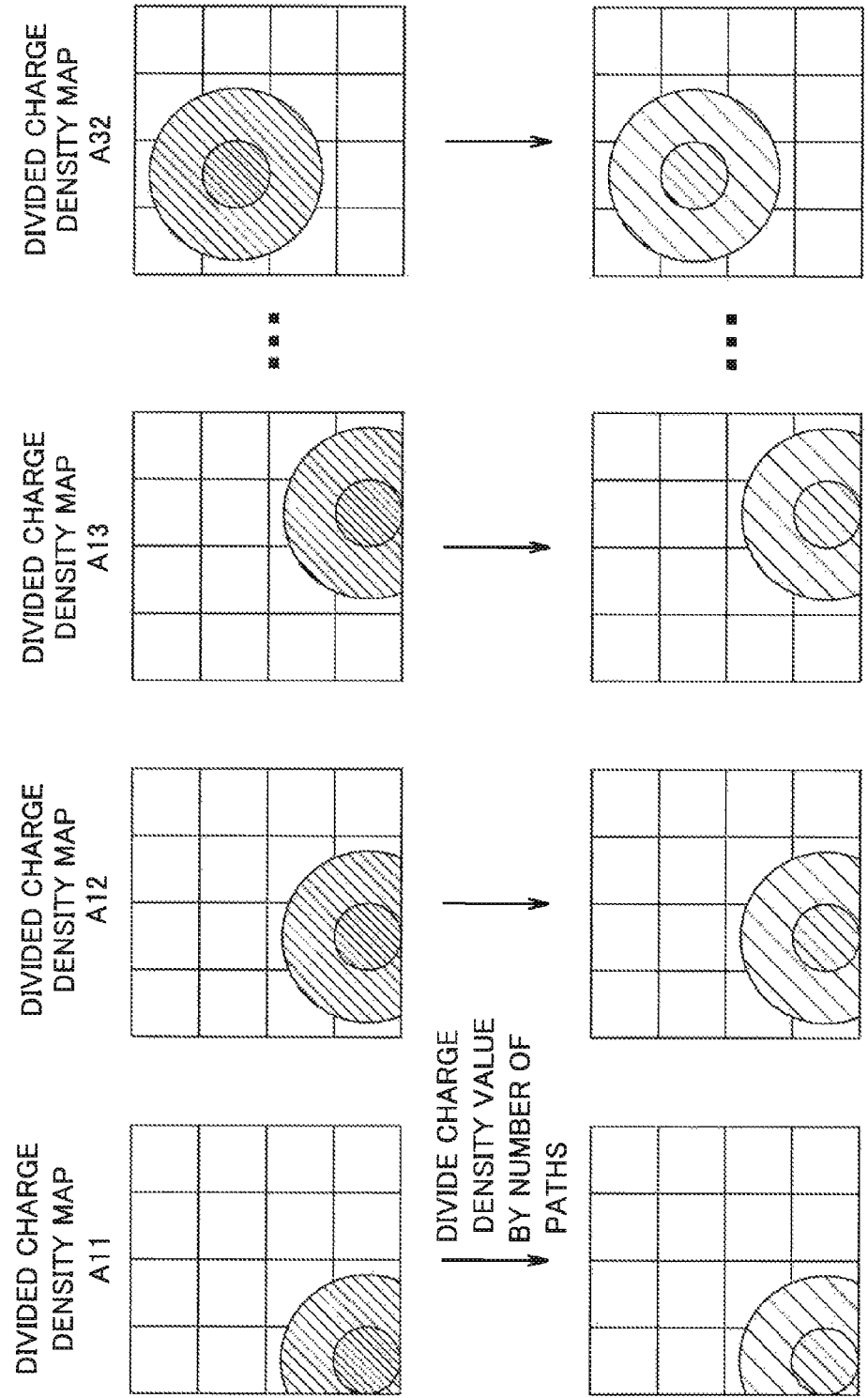

PROGRAM FOR CORRECTING CHARGED PARTICLE RADIATION LOCATION, DEVICE FOR CALCULATING DEGREE OF CORRECTION OF CHARGED PARTICLE RADIATION LOCATION, CHARGED PARTICLE RADIATION SYSTEM, AND METHOD FOR CORRECTING CHARGED PARTICLE RADIATION LOCATION

CROSS-REFERENCE TO RELATED APPLICATIONS

This application is the national phase under 35 U.S.C. §371 of PCT International Application No. PCT/JP2014/051308, filed Jan. 22, 2014, which claims the benefit of Japanese Application No. 2013055276, filed Mar. 18, 2013, the entire contents of the aforementioned applications are hereby incorporated herein by reference.

TECHNICAL FIELD

The invention relates to a program for a correction program for a charged particle beam irradiation position, a correction amount calculation device for a charged particle beam irradiation position, a charged particle beam irradiation system, and a correction method for a charged particle beam irradiation position.

BACKGROUND ART

In a drawing process such as lithography using a charged particle beam, there have been some cases where a resist applied to a surface of a work piece is charged due to irradiation of the charged particle beam, and a trajectory of the charged particle beam is distorted due to charging, so that an error occurs in an irradiation position. This has led to a decrease in a positional accuracy of a drawing pattern formed on the work piece.

In order to suppress such an error, for example, disclosed is a technique for: estimating a charge distribution of a work piece from a drawing pattern; defining a convolution integration between the charge distribution and a response function that is an amount of deviation of a pattern with respect to a single unit charging amount as an error amount of an irradiation position; and calculating a correction amount of the irradiation position from the error amount (e.g. Patent Document 1).

However, according to electromagnetism, a superposition principle is satisfied with respect to an electric field or a potential, but the superposition principle is not satisfied with respect to a spatial position function for a charged particle. Accordingly, there are some cases where an accurate result may not be obtained from a calculation of the error amount using the above-described convolution integration between the charge distribution and the response function.

In addition, another method may be considered, in which a trajectory of a charged particle beam is calculated based on an estimated charge distribution according to electromagnetism and a correction amount of an irradiation position and an error amount of the irradiation position are calculated. However, in this case, as the charged particle beam approaches the charged position of a work piece, the strength of an electric field is close to infinity and it is impossible to perform a calculation due to excessive performance required of a computer, accordingly. In this manner, there has been a problem in that it is impossible to calculate the error amount or the correction amount at the charged position.

Patent Document 1: Japanese Unexamined Patent Application, Publication No. 2007-324175

DISCLOSURE OF THE INVENTION

Problems to be Solved by the Invention

The invention is to provide a correction program for a charged particle beam irradiation position, a correction amount calculation device for a charged particle beam irradiation position, a charged particle beam irradiation system, and a correction method for a charged particle beam irradiation position capable of improving a positional accuracy of a drawing pattern by accurately correcting the irradiation position of a charged particle beam.

Means for Solving the Problems

The invention solves the aforementioned problem, as described below. For the better understanding, descriptions will be given by using corresponding reference numerals of embodiments of the invention, but the invention is not limited thereto. In addition, components described by using the reference numerals may be appropriately modified, or at least a portion of the components may be replaced with other components.

According to the first invention, there is provided a correction program for a charged particle beam irradiation position of correcting an irradiation position of a charged particle beam irradiated on a work piece (M) applied with a resist (R), the correction program configured to cause a computer (22) to perform functions including: a charge density distribution calculation unit which replaces charging of the resist caused by irradiation of the charged particle beam with surface charges at an interface between the resist and the work piece and calculates a charge density distribution for each mesh (A) of the replaced surface charges; a trajectory calculation unit which calculates a trajectory of a charged particle from an emission position of the charged particle beam to a surface of the resist based on the charge density distribution; an error amount calculation unit which calculates an error amount of the irradiation position of the charged particle beam based on the calculated trajectory; and an irradiation position correction amount calculation unit which calculates a correction amount of the irradiation position of the charged particle beam based on the calculated error amount.

According to the second invention, there is provided the charged particle beam irradiation position correction program according to the first invention, wherein the trajectory calculation unit calculates the trajectory based on only the charge density among the charge density distribution, the charge density being generated by an area where the charged particle beam irradiation is completed.

According to the third invention, there is provided the charged particle beam irradiation position correction program according to the first or second invention, wherein in a case where the charged particle beam is irradiated on the resist (R) a plurality of instances, the charge density distribution calculation unit produces a charge density distribution according to an irradiation situation of each of the instances.

According to the fourth invention, there is provided the charged particle beam irradiation position correction program according to the third invention, wherein the trajectory calculation unit calculates a trajectory corresponding to the irradiation situation of each of the instances based on the charge density distribution associated with the irradiation situation, wherein the error amount calculation unit calculates an error amount corresponding to the irradiation situation of each of the irradiation instances based on the trajectory associated with the irradiation situation, and wherein the irradiation position correction amount calculation unit calculates a correction amount corresponding to the irradiation situation of each of the instances based on the error amount associated with the irradiation situation and determines the correction amount as a correction amount of the irradiation position of the charged particle beam of each of the instances.

According to the fifth invention, there is provided the charged particle beam irradiation position correction program according to the third invention, wherein the trajectory calculation unit calculates a trajectory corresponding to the irradiation situation based on the charge density distribution associated with the irradiation situation, wherein the error amount calculation unit calculates an error amount corresponding to the irradiation situation based on the trajectory associated with the irradiation situation, and wherein the irradiation position correction amount calculation unit calculates a correction amount corresponding to the irradiation situation based on the error amount associated with the irradiation situation and determines an average value of calculated correction amounts as a correction amount of the irradiation position of the charged particle beam.

According to the sixth invention, there is provided a correction amount calculation device (20) for a charged particle beam irradiation position, including: a storage unit (21) which stores the correction program for the charged particle beam irradiation position according to any one of the first to fifth inventions; and a calculation unit (22) which reads the correction program from the storage unit and executes the correction program.

According to the seventh invention, there is provided a charged particle beam irradiation system (1) including: the correction amount calculation device (20) for the charged particle beam irradiation position according to the sixth invention; and a charged particle beam irradiation device (10) which irradiates the charged particle beam.

According to the eighth invention, there is provided a correction method for a charged particle beam irradiation position of correcting an irradiation position of a charged particle beam irradiated on a work piece (M) applied with a resist (R), the method including: replacing charging of the resist caused by irradiation of the charged particle beam with surface charges at an interface between the resist and the work piece and calculating a charge density distribution for each mesh of the replaced surface charges; calculating a trajectory of a charged particle from an emission position of the charged particle beam to a surface of the resist based on the charge density distribution; calculating an error amount of the irradiation position of the charged particle beam based on the calculated trajectory; and calculating a correction amount of the irradiation position of the charged particle beam based on the calculated error amount.

Effects of the Invention

According to the invention, it is possible to correct accurately an irradiation position of a charged particle beam, such that a positional accuracy of a drawing pattern is increased.

BRIEF DESCRIPTION OF THE DRAWINGS

FIG. 4 is a diagram illustrating a relationship between primary electron energy and a secondary electron emission ratio.

FIG. 5 is a diagram illustrating a relationship between an emission position of an electron beam and an irradiation position on the mask substrate M.

FIGS. 7A and 7B are each a diagram illustrating another form of a correction amount calculation process executed by the correction program.

FIG. 8 is a diagram illustrating a divided charge density map that is divided into areas (meshes) and a divided charge density map that is divided by the number of paths, in multi-path drawing.

PREFERRED MODE FOR CARRYING OUT THE INVENTION

First Embodiment

Hereinafter, embodiments of the invention will be described with reference to the drawings.

Figure 1:
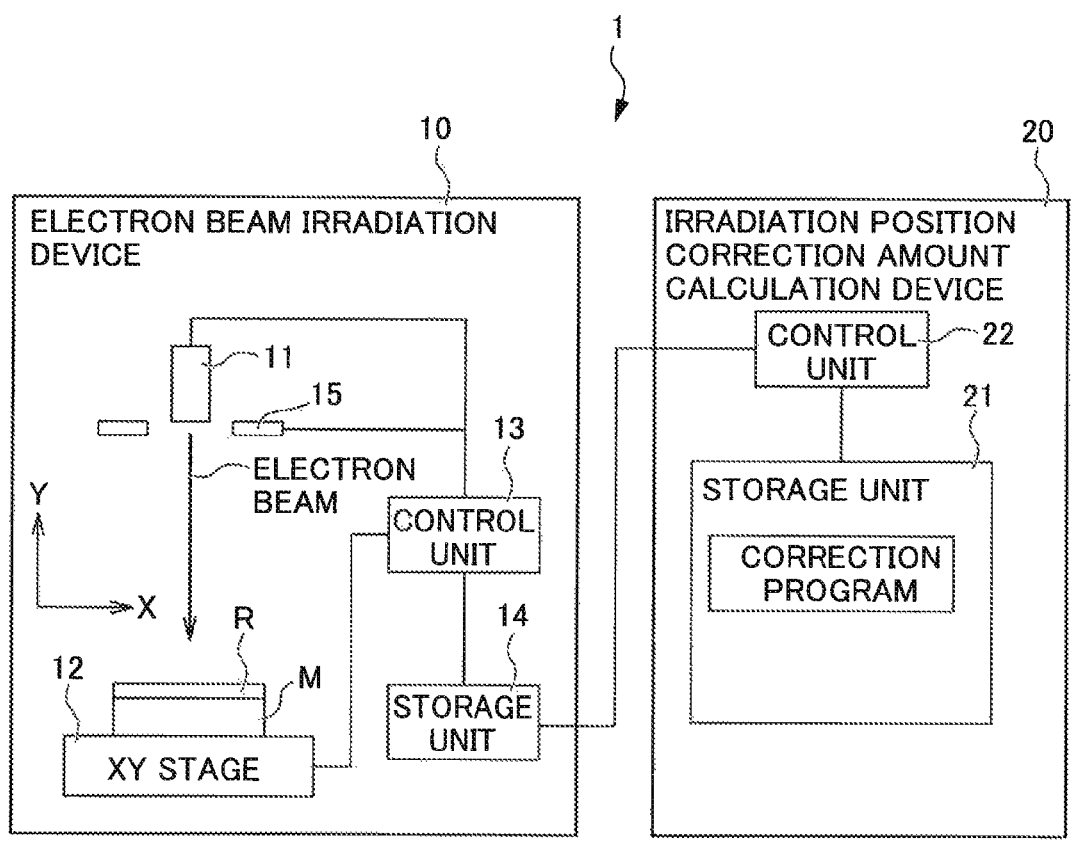
FIG. 1 is a diagram illustrating a configuration of a drawing system 1 according to an embodiment.

FIG. 1 is a diagram illustrating a configuration of a drawing system 1 according to an embodiment.

In FIG. 1, an electron beam irradiation direction is set to a Z-direction, and directions perpendicular to the irradiation direction are set to an X-direction and a Y-direction.

The drawing system (charged particle beam irradiation system) 1 is an apparatus for irradiating a mask substrate (work piece) 100 with an electron beam as a charged particle beam to draw a predetermined pattern on a mask substrate M to produce a photomask. As illustrated in FIG. 1, the drawing system 1 includes an electron beam irradiation device 10, a correction amount calculation device 20, and the like.

The electron beam irradiation device 10 includes an electron gun 11, an XY stage 12, a control unit 13, a storage unit 14, a deflector 15, and the like.

The electron gun 11 irradiates the mask substrate M placed on the XY stage 12 with the electron beam. In the embodiment, the electron gun 11 is arranged vertically upward (+Z-direction) position with respect to the XY stage 12 to irradiate the mask substrate M placed on the XY stage 12 with the electron beam from this position.

The XY stage 12 is a work stage which moves in a horizontal plane (XY plane) while the mask substrate M is placed on the XY stage 12. The XY stage 12 causes the placed mask substrate M to move, such that the XY stage 12 allows an irradiation position of the electron beam of the electron gun 11 and a processing position of the mask substrate M to agree with each other in collaboration with the deflector 15.

The control unit 13 is a control circuit which performs integrated control of components of the drawing system 1 and is configured with, for example, a central processing unit (CPU) and the like. The control unit 13 appropriately reads and executes various programs stored in the storage unit 14 to realize various functions associated with the subject invention in cooperation with the above-described hardware.

The control unit 13 controls the electron gun 11 to irradiate the electron beam while controlling driving of the XY stage 12 based on a drawing pattern or a correction map (described later) stored in the storage unit 14 to form a predetermined pattern on the mask substrate M.

The storage unit 14 is a storage device such as a hard disk and a semiconductor memory device for storing programs, information, and the like required for operating the electron beam irradiation device 10. As described above, the storage unit 14 also stores the information on the drawing pattern of the photomask and the like. In addition, the storage unit 14 is connected to the control unit 22 (described later) of the correction amount calculation device 20 and stores a correction map output from the correction amount calculation device 20.

The deflector 15 is a unit configured to change a deflection angle of an electron beam irradiated from the electron gun 11.

The correction amount calculation device 20 is a device which calculates a correction amount of an irradiation position of an electron beam irradiated on a surface of the resist R applied on the mask substrate M to produce a correction map. Herein, in general, if a work piece such as a mask substrate applied with a resist is irradiated with a charged particle beam such as an electron beam, the resist is charged. Accordingly, a trajectory of the charged particle beam is distorted due to the charging, so that an error occurs at an irradiation position of the charged particle beam. This leads to a decrease in a positional accuracy of a drawing pattern formed on the work piece. In order to prevent the charging, a metal film on a surface of the mask substrate is earthed (grounded). However, this preventive measure cannot remove the electrical charges accumulated on the surface of the resist sufficiently.

The correction amount calculation device 20 according to the embodiment estimates a charge density distribution corresponding to the charging of the resist and calculates a correction amount for correcting the above-mentioned error at the irradiation position of the electron beam due to the charged resist.

The correction amount calculation device 20 includes a storage unit 21, a control unit 22 (computer), and the like.

The storage unit 21 is a storage device for storing programs, information and the like required for operating the correction amount calculation device 20, the storage device including a hard disk, a semiconductor memory device and the like. In addition, the storage unit 21 stores a correction program for calculating the correction amount of the irradiation position of the electron beam irradiated on the mask substrate M.

The control unit 22 is a control circuit which performs integrated control of the correction amount calculation device 20 and is configured with, for example, a central processing unit (CPU) and the like. The control unit 22 reads and executes the correction program stored in the storage unit 21 to calculate the correction amount of the irradiation position of the electron beam irradiated from the electron gun 11 and outputs the calculation result (correction map) to the storage unit 14 of the electron beam irradiation device 10.

The mask substrate M is a substrate for a photomask, which is of glass and the like. With the irradiation of the electron beam, a predetermined pattern is formed on the mask substrate M, so that the photomask is produced.

The resist R is applied to the surface of the mask substrate M. The resist R is an electron beam resist, a chemical resistance of which changes at an irradiation position when the resist R in a thin film is irradiated by an electron beam. As an example, ZEP7000 or the like manufactured by Nippon Zeon Corporation may be used. In addition, a chemical-amplification-type resist may be used as the resist R. As an example, NEP-171 manufactured by FUJIFILM Electronic Materials Co., Ltd., NEB-22 manufactured by Sumitomo Chemical Co., Ltd., or the like may be used.

The technique of the invention is applicable to a case where the charging of the resist cannot be completely prevented by an anti-charging film used for the resist R which has a two-layered structure using an anti-charging film as an upper layer and an electron beam resist as a lower layer. As an example of the anti-charging film, aquaSAVE manufactured by Mitsubishi Rayon Corporation or the like may be used.

In this manner, it is possible to use various types regardless of a nonchemical-amplification-type resist or a chemical-amplification-type resist, or regardless of a positive-type resist or a negative-type resist. In addition, a resist internally containing an anti-charging film can also be used as the resist R. Furthermore, it may be acceptable as a material for the resist R only if the material generates charging slightly by drawing.

Next, operational descriptions of the correction program stored in the correction amount calculation device 20 will be given.

Figure 2:
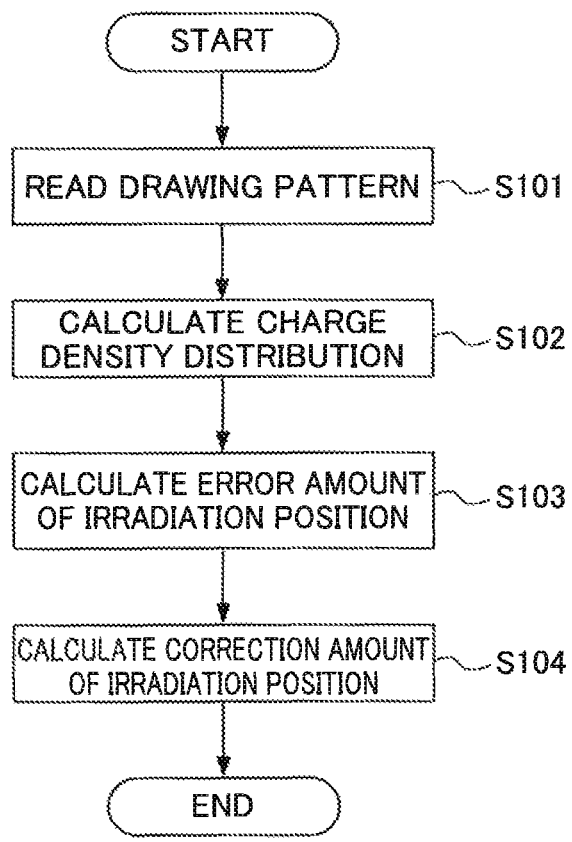
FIG. 2 is a flowchart illustrating operations of a correction program stored in a correction amount calculation device 20 according to an embodiment.

FIG. 2 is a flowchart illustrating the operations of the correction program stored in the correction amount calculation device 20 according to the embodiment.

FIG. 3 is a diagram illustrating the charged state of the resist R applied to the mask substrate M according to the embodiment.

Figure 3A:
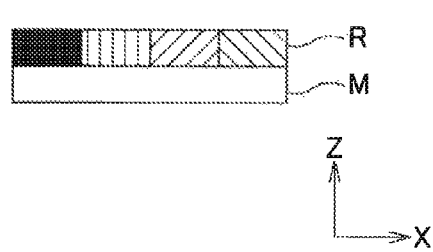
FIGS. 3A to 3C are each a diagram illustrating a charged state of a resist R applied on a mask substrate M according to an embodiment.
Figure 3B:
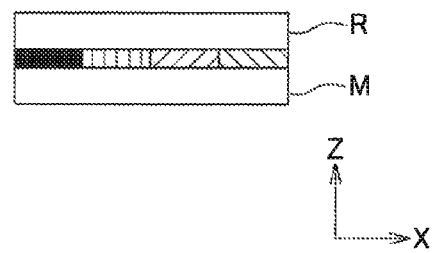
Figure 3C:
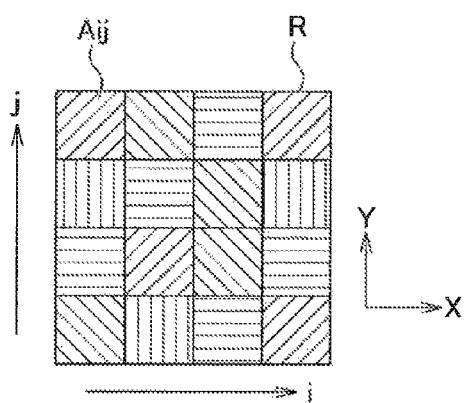

FIG. 3A, which is a side view for the mask substrate M, illustrates the charged state of the resist R. FIG. 3B is a schematic diagram of a case where the charging of the resist R is replaced with surface charges at the interface between the resist R and the mask substrate M. FIG. 3C is a plan view showing a charge density distribution where charging shown in FIG. 3B is represented as a charge density for each of planar meshes, and a position of the charge density in a height direction corresponds to the interface between the resist R and the mask substrate M as illustrated in FIG. 3B.

FIG. 4 is a diagram illustrating a relationship between primary electron energy and a secondary electron emission ratio.

FIG. 5 is a diagram illustrating a relationship between an emission position of an electron beam and an irradiation position on a mask substrate M.

Figure 6A:
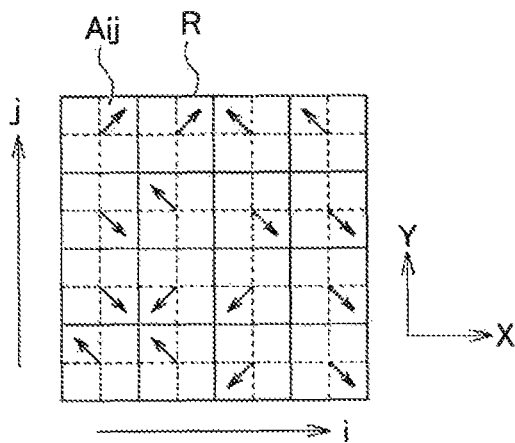
FIGS. 6A and 6B are each a diagram illustrating vectors of error amounts and correction amounts calculated by the correction program.
Figure 6B:
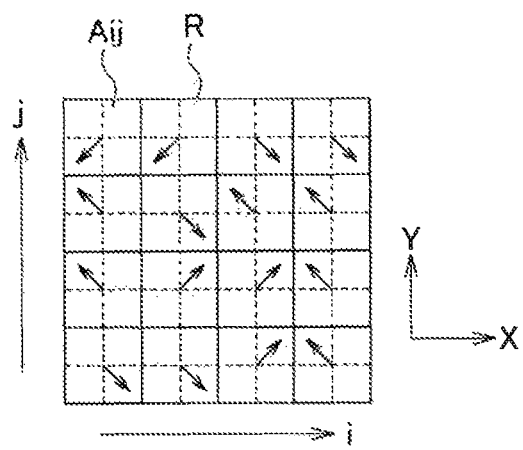

FIGS. 6A and 6B are each a diagram illustrating vectors of the error amounts and the correction amounts calculated by the correction program.

In FIGS. 3A to 3C, 5, and 6A and 6B, the irradiation direction of the electron beam (a thickness direction of the mask substrate M) is defined as the Z-direction, and directions perpendicular to the irradiation direction (thickness direction) are defined respectively as an X-direction and a Y-direction, similarly to FIG. 1.

The control unit 22 of the correction amount calculation device 20 reads the correction program stored in the storage unit 21 and calculates the correction amount of the irradiation position of the electron beam for a drawing pattern.

First, as illustrated in FIG. 2, in S101, the control unit 22 acquires information on the drawing pattern from the storage unit 14 through the control unit 13 of the electron beam irradiation device 10.

Next, in S102, as illustrated in FIG. 3C, the control unit 22 calculates an estimation of a charge density distribution for each mesh of the resist R charged by the irradiation of the electron beam through the later-described method or the like based on the acquired information on the drawing pattern (charge density distribution calculation unit). In a model of the invention, charging of the resist R illustrated in FIG. 3A is replaced with the surface charges at the interface between the resist R and the mask substrate M illustrated in FIG. 3B. Namely, the position of the calculated charge density distribution of FIG. 3C in the height direction is at the interface between the resist R and the mask substrate M.

Herein, the calculation for estimating the charge density distribution is executed, for example, according to the following method.

When an electron beam is incident on a sample, secondary electrons are emitted according to incident electron energy (primary electron energy). Let us denote the ratio of the number of secondary electrons to the number of incident electrons as $\delta_s$ (secondary electron emission ratio). When $\delta_s<1$ as illustrated in FIG. 4, the irradiation portion of the sample is negatively charged as a whole since the number of secondary electrons is smaller than the number of incident electrons. On the other hand, when $\delta_s>1$, the irradiation portion of the sample is positively charged as a whole since the number of secondary electrons is larger than the number of incident electrons.

If an electron beam is irradiated on the sample, electrons including reflected primary electrons, secondary electrons, and the like are emitted externally from the sample. The emitted electrons undergo a large number of collisions with a lower barrel portion of the irradiation device or the like and the sample, so that the emitted electrons scatter to a vicinity other than the irradiation area. In this manner, the emitted electrons cause a phenomenon of providing electrons to a wide range of the sample, a so-called fogging phenomenon.

The electrons gradually lose energy due to multiple scattering caused by the fogging phenomenon. Accordingly, whether the sample is charged positively or negatively depends on the energy state of the electrons incident on the sample.

As illustrated in FIG. 4, for convenience, an energy region for negatively charging a sample in the vicinity of an acceleration voltage is denoted by a "negative region I"; an energy region for positively charging a sample in an intermediate zone is denoted by a "positive region"; and an energy region for negatively charging a sample in a low energy zone is denoted by a "negative region II". A charge distribution generated in each of the energy regions is calculated, and the charge density distribution is calculated by adding charge distributions. It is assumed that the closer to the irradiation area, the larger number of electrons having undergone scattering a small number of times and having high energy (close to the acceleration voltage) are incident. Based on this assumption, it is so determined that the electrons in the negative region I are distributed in a first range of the vicinity of the irradiation area, the electrons in the positive region are distributed in a second range wider than the first range, and electrons in the negative region II are distributed in a third range wider than the second range.

More specifically, the charge density distribution of the resist R due to charging is obtained by convolution integration of a pattern area density "g" and a Gauss function using the following formula (1).

$$\rho(x,y) = \frac{\kappa_{m1}}{\sigma_{m1}^2 \pi} \int_{-\infty}^{+\infty}\int_{-\infty}^{+\infty} g(x',y') e^{-\frac{(x-x')^2+(y-y')^2}{\sigma_{m1}^2}} dx' dy' + \frac{\kappa_p}{\sigma_p^2 \pi} \int_{-\infty}^{+\infty}\int_{-\infty}^{+\infty} g(x',y') e^{-\frac{(x-x')^2+(y-y')^2}{\sigma_p^2}} dx' dy' + \frac{\kappa_{m2}}{\sigma_{m2}^2 \pi} \int_{-\infty}^{+\infty}\int_{-\infty}^{+\infty} g(x',y') e^{-\frac{(x-x')^2+(y-y')^2}{\sigma_{m2}^2}} dx' dy' \quad (1)$$

$$\rho(x,y) = \frac{\kappa_{m1}}{\sigma_{m1}^2 \pi} \sum_i \sum_j h^2 g_{ij} e^{-\frac{(x-x')^2+(y-y')^2}{\sigma_{m1}^2}} + \frac{\kappa_p}{\sigma_p^2 \pi} \sum_i \sum_j h^2 g_{ij} e^{-\frac{(x-x')^2+(y-y')^2}{\sigma_p^2}} + \frac{\kappa_{m2}}{\sigma_{m2}^2 \pi} \sum_i \sum_j h^2 g_{ij} e^{-\frac{(x-x')^2+(y-y')^2}{\sigma_{m2}^2}} \quad (2)$$

$$\rho'(x,y) = \frac{\kappa_{m1}}{\sigma_{m1}^2 \pi} h^2 g_{ij} e^{-\frac{(x-x')^2+(y-y')^2}{\sigma_{m1}^2}} + \frac{\kappa_p}{\sigma_p^2 \pi} h^2 g_{ij} e^{-\frac{(x-x')^2+(y-y')^2}{\sigma_p^2}} + \frac{\kappa_{m2}}{\sigma_{m2}^2 \pi} h^2 g_{ij} e^{-\frac{(x-x')^2+(y-y')^2}{\sigma_{m2}^2}} \quad (3)$$

Herein, $\rho$ denotes charge density; $\sigma_{m1}$ denotes an influence range (scattering radius) of the negative region I; and $\kappa_{m1}$ denotes a coefficient representing easiness of the negative charging of the resist R due to the negative region I. Similarly, $\sigma_p$ denotes an influence range (scattering radius) of the positive region; and $\kappa_p$ denotes a coefficient representing easiness of the positive charging of the resist R due to the positive region: $\sigma_{m2}$ denotes an influence range (scattering radius) of the negative region II; and $\kappa_{m2}$ denotes a coefficient representing easiness of the negative charging of the resist R due to the negative region II. In this connection, $\kappa_{m1}<0$, $\kappa_p>0$, $\kappa_{m2}<0$; and $\sigma_{m1}<\sigma_p<\sigma_{m2}$.

In addition, if a trapezoidal integration formula is applied to the above-described formula (1), the formula (1) can be transformed to the formula (2). Accordingly, a charge density $\rho'$ (divided charge density map) generated by one mesh $A_{ij}$ (described later) in an area density map can be obtained from the above-described formula (3).

In the embodiment, as illustrated in FIG. 3C, an example is adopted for an explanation purpose, where a surface of the resist R is divided by four in each of up-down and right-left directions into 16 divided areas A having a square shape for each mesh. However, the surface of the mask substrate is practically meshed into a large number of areas each having a lattice shape.

Each area of the divided resist R is denoted by $A_{ij}$, and a charge density of the area $A_{ij}$ is denoted by $\rho_{ij}$ [C/m$^2$]. Herein, "i" denotes the number of divisions of the resist R in the left-right direction, and "j" denotes the number of divisions in the up-down direction. In the embodiment, i=1 to 4, and j=1 to 4. For example, the lowest-leftmost area A in FIG. 3C is $A_{11}$, and the charge density $\rho$ is $\rho_{11}$. Similarly, the lowest-rightmost area A is $A_{41}$, and the charge density $\rho$ is $\rho_{41}$.

In S103, with respect to each area to be calculated, the control unit 22 obtains a position and velocity of the charged particle moving from an emission position of the electron beam to the surface of the resist R and a strength E of the electric field exerted on the charged particle at each position in parallel. Subsequently, the control unit 22 calculates a trajectory of the charged particle based on the thus obtained (trajectory calculation unit). An error (error amount) of the irradiation position of the charged particle beam on the surface of the resist is calculated based on the calculated trajectory (error amount calculation unit).

Specifically, as a method of obtaining the electric field, the strength $E_x$, $E_y$, and $E_z$ of the electric field are calculated according to the following formulas (4) to (6).

Herein, as illustrated in FIG. 5, (x, y, z) in the formulas (4) to (6) denotes coordinates of a position "r" of the charged particle in the X-, Y-, and Z-directions. In addition, $(x_0, y_0, z_0)$ denotes coordinates of an emission position $r_0$ of an electron beam, and $(x_\Delta, y_\Delta, z_\Delta)$ denotes a shift from $r_0$. $\in_0$ denotes a dielectric constant of vacuum. $\rho(x', y')$ denotes a charge density of the resist R at coordinates (x', y').

In addition, a coordinate of the interface between the resist R and the mask substrate M in the vertical direction (Z-direction) is set to z=0, and a coordinate of the surface of the resist R is set to $z=z_h$.

$$E_x(x, y, z) = \frac{1}{4\pi\varepsilon_0} \int_{-\infty}^{+\infty} \int_{-\infty}^{+\infty} \rho(x', y') \quad (4)$$

$$\frac{x_\Delta + x_0 - x'}{[(x_\Delta + x_0 - x')^2 + (y_\Delta + y_0 - y')^2 + (z_\Delta + z_0)^2]^{\frac{3}{2}}} dx' dy'$$

$$E_y(x, y, z) = \frac{1}{4\pi\varepsilon_0} \int_{-\infty}^{+\infty} \int_{-\infty}^{+\infty} \rho(x', y') \quad (5)$$

$$\frac{y_\Delta + y_0 - y'}{[(x_\Delta + x_0 - x')^2 + (y_\Delta + y_0 - y')^2 + (z_\Delta + z_0)^2]^{\frac{3}{2}}} dx' dy'$$

$$E_z(x, y, z) = \frac{1}{4\pi\varepsilon_0} \int_{-\infty}^{+\infty} \int_{-\infty}^{+\infty} \rho(x', y') \quad (6)$$

$$\frac{z_\Delta + z_0}{[(x_\Delta + x_0 - x')^2 + (y_\Delta + y_0 - y')^2 + (z_\Delta + z_0)^2]^{\frac{3}{2}}} dx' dy'$$

In the calculation of integrations in the formulas (4) to (6), the integrations may be approximated by using an appropriate numerical calculation method. For example, if a trapezoidal integration formula is applied, the formulas (4) to (6) are transformed to the following formula (4)' to (6)'. Herein, "h" denotes a mesh size, and $\rho_{ij}$ denotes a charge density for an ij-th mesh. The following formulas are same as those of a case where it is assumed that a point charge having a charge corresponding to a total charge amount of a mesh exists at the center of the mesh and the charge density of each mesh is replaced with the point charge.

$$E_x(x, y, z) = \frac{1}{4\pi\varepsilon_0} \quad (4)'$$

$$\sum_i \sum_j \left[ h^2 \rho_{ij} \frac{x_\Delta + x_0 - x_i}{[(x_\Delta + x_0 - x_i)^2 + (y_\Delta + y_0 - y_j)^2 + (z_\Delta + z_0)^2]^{\frac{3}{2}}} \right]$$

$$E_y(x, y, z) = \frac{1}{4\pi\varepsilon_0} \quad (5)'$$

$$\sum_i \sum_j \left[ h^2 \rho_{ij} \frac{y_\Delta + y_0 - y_j}{[(x_\Delta + x_0 - x_i)^2 + (y_\Delta + y_0 - y_j)^2 + (z_\Delta + z_0)^2]^{\frac{3}{2}}} \right]$$

$$E_z(x, y, z) = \frac{1}{4\pi\varepsilon_0} \quad (6)'$$

$$\sum_i \sum_j \left[ h^2 \rho_{ij} \frac{z_\Delta + z_0}{[(x_\Delta + x_0 - x_i)^2 + (y_\Delta + y_0 - y_j)^2 + (z_\Delta + z_0)^2]^{\frac{3}{2}}} \right]$$

In addition, in S103, the control unit 22 obtains the position "r" and velocity "v" of the charged particle from the irradiation position of the electron beam to the surface $(z=z_h)$ of the resist R by the following formulas (7) to (12).

Herein, $(v_x, v_y, v_z)$ denotes velocities [m/s$^2$] of the charged particle in each of the X-, Y-, and Z-directions. In addition, "m" and "q" denote mass [kg] and charge [C] of the charged particle, respectively. Herein, the "q" may take a negative value in case of an electron beam, and the "q" may take of either a positive or negative value in case of an ion beam according to a type of an ion.

In addition, as an initial condition of the calculation according to the formulas (7) to (12), the position of the charged particle at t=0 [sec] is $r=r_0$, and in other words, a shift amount at t=0 [sec] is $(x_\Delta, y_\Delta, z_\Delta)=(0, 0, 0)$. In addition, the velocity (initial velocity) of the charged particle at t=0 is $(v_x, v_y, v_z)=(0, 0, -v_0)$. Since the electron beam is irradiated from the electron gun 11 to the surface of the resist R vertically downward (minus Z-direction), an initial velocity of the charged particle in the Z-direction is $-v_0$, accordingly. The initial velocity $v_0$ is a value appropriately determined according to an acceleration voltage of the irradiation device.

In addition, the coordinates $(x_0, y_0)$ of the emission position $r_0$ of an electron beam in a horizontal plane represent the coordinates of the center of an area A to be irradiated. The vertical coordinate $z_0$ of the emission position $r_0$ is the height of the electron gun 11 from the substrate.

In addition, if the velocity of the electron beam is close to the speed of light, a coordinate system obtained by applying Lorentz transform to the coordinate system of the formulas (4) to (12) may be used as a substitute.

$$\frac{dv_x}{dt} = \frac{q}{m} E_x(x, y, z) \quad (7)$$

$$\frac{dv_y}{dt} = \frac{q}{m} E_y(x, y, z) \quad (8)$$

$$\frac{dv_z}{dt} = \frac{q}{m} E_z(x, y, z) \quad (9)$$

$$\frac{dx}{dt} = v_x \quad (10)$$

$$\frac{dy}{dt} = v_y \quad (11)$$

$$\frac{dz}{dt} = v_z \quad (12)$$

The details of S103 are described. First, with respect to the area A, for which an irradiation is performed and a calculation is made, the control unit 22 calculates an electric field in the above-described initial condition by using the formulas (4) to (6). Next, the control unit 22 calculates a position and velocity of the particle after a lapse of an infinitesimal amount of time based on the obtained electric field by using the formulas (7) to (12). Similarly, the control unit 22 obtains an electric field at the thus obtained position and obtains a position and velocity of the particle after a further lapse of an infinitesimal amount of time. This process is repeated, and if a position of the particle reaches the surface $(z=z_h)$ of the resist R, the repetition of the calculation is stopped. The $x_\Delta$, $y_\Delta$ calculated as described above result in the error amount of the irradiation position of the area A. In S103, the above-described process is executed for each area, for which the calculation is to be performed.

With respect to the calculated error amount, it is possible to show an error shift of the charged particle on the surface of the resist R in vector form for each area A meshed on the surface of the resist R through the above-described S103, as illustrated in FIG. 6A. Herein, the error amount in each area A is approximated with the calculated error amount at the center of the area A.

In S104, the control unit 22 calculates a correction amount of the irradiation position of the electron beam for each area A of the resist R based on the data of the calculated error amount (irradiation position correction amount calculation unit). More specifically, the control unit 22 calculates an inverse vector of a vector of the error amount calculated in S103. Next, as illustrated in FIG. 6B, the control unit 22 produces a distribution of correction amount vectors based on the calculated correction amount to produce a correction map.

The overall operation of the drawing system 1 will now be described.

First, in the drawing system 1, the control unit 22 of the correction amount calculation device 20 calculates in advance the correction amount for correcting the error of the irradiation position of the electron beam caused by charging of the resist R by using the above-described correction program to produce the correction map before the electron beam is irradiated. Next, the control unit 22 outputs the produced correction map to the storage unit 14 of the electron beam irradiation device 10.

The control unit 13 reads the correction map, which has been received from the correction amount calculation device 20, from the storage unit 14 and causes the electron gun 11 to irradiate electron beams while controlling driving of the XY stage 12 and the deflector 15. Accordingly, the drawing system 1 corrects the irradiation position of the electron beam distorted by charging of the resist R, so that it is possible for the drawing system 1 to form a predetermined pattern accurately on the mask substrate M.

Next, another embodiment of the correction amount calculation process of the drawing system 1 will be described.

FIGS. 7A and 7B are each a diagram illustrating another embodiment of the correction amount calculation process executed by the correction program. FIG. 7A is a diagram illustrating a divided charge density map which is a charge density distribution occurring only in a single area (mesh), and FIG. 7B is a diagram illustrating an irradiation state of the electron beam on the resist R.

FIG. 8 is a diagram in multi-path drawing, the diagram illustrating a divided charge density map which is divided for each area (mesh) and a divided charge density map which is divided by the number of paths.

As illustrated in FIG. 7A, in the drawing system 1, the control unit 22 of the correction amount calculation device 20 may produce, in advance before the irradiation of the electron beam, divided charge density maps for an entire photomask, each single mesh area of which is drawn independently. Subsequently, the control unit 22 may estimate the charge density distribution of the resist R by adding only the maps corresponding to the areas having been subjected to the electron beam irradiation. By using the above-described method, the control unit 22 may calculate the trajectory and the error amount of the charged particle and calculate the correction amount.

As illustrated in FIG. 7B, the control unit 22 performs the calculation in the following manner, for example, for a case in which the electron beam is irradiated on areas in order of $A_{11}$ to $A_{14}$, $A_{21}$ to $A_{24}$, and $A_{31}$ in advance, and the electron beam is to be irradiated on the area $A_{32}$. The control unit 22 calculates the correction amount by treating the divided charge density map of the area $A_{32}$ added to the summation of the divided charge density maps of the areas $A_{11}$ to $A_{31}$, which are calculated in advance, as the charge density distribution used for calculation of the trajectory of the area $A_{32}$.

In addition, the charge density distribution which is used for calculation of the area $A_{33}$ may be obtained by adding the divided charge density map of the area $A_{33}$ to the charge density distribution used for the area $A_{32}$. By doing so, the drawing system 1 can increase the accuracy of calculation of the correction amount and reduce the calculation load of the control unit 22.

In addition, in the above example, the addition of the divided charge density maps including the divided charge density map of the area of interest is used for the calculation of the correction amount of the calculation object area (mesh). However, the invention is not limited thereto, and it may be alternatively possible that the addition of the divided charge density maps up to the area one before is used for the calculation of the correction amount of the calculation object area (mesh).

In addition, in the case of applying multi-path drawing where a same pattern is drawn overlapped on a mask substrate M at a plurality of instances with divided doses, charged states of a resist R in the vicinity of the irradiation position differ from each other in the irradiation instances of the electron beam. For these reasons, the drawing system 1 may produce a charge density distribution according to an irradiation situation of each of the instances and calculate a correction amount according to the irradiation situation. In this manner, it is also possible for the drawing system 1 to correct the irradiation position of the electron beam by using different correction maps for the instances, respectively, and to increase the positional accuracy of the drawing pattern of each of the instances for a case of applying the multi-path drawing.

More specifically, the charge density value in the divided charge density map is divided by the number of paths and the divided charge density map for each path is produced as illustrated in FIG. 8. Similarly to the above-described case, the charge density distribution may be defined by adding the divided charge density maps according to order of the irradiation. If the irradiation position of the electron beam of the first path reaches the final irradiation position ($A_{44}$ illustrated in FIG. 7B), the addition may be started from the area $A_{11}$ of the divided charge density map of the second path. The above calculation is repeated for the number of irradiation instances of the multi-path.

Furthermore, for a case where the charge density distribution according to the irradiation situation is produced and the correction amount is calculated as described above, it may be possible that an average of the calculated correction amounts of the irradiation instances is obtained and the average correction amount is used as a correction amount for each irradiation instance of the electron beam. In this manner, in the case of applying the multi-path drawing, even in a case where only the single correction map is limitedly used, the drawing system 1 can calculate the correction amount of the electron beam by taking into consideration the situation where the drawing is performed overlapped at the plurality of irradiation instances, so that it is possible to increase the positional accuracy of the drawing pattern as a whole.

The drawing system 1 according to the embodiment described above results in the following effects.

(1) The drawing system 1 according to the embodiment replaces the charging of the resist R due to the irradiation of the electron beam with the surface charges at the interface of the resist R and the mask substrate M, and calculates the charge density distribution of the surface charges thus obtained. Next, the drawing system 1 calculates the trajectory of the electron beam based on the charge density distribution, the error amount of the irradiation of the electron beam based on the obtained trajectory, and the correction amount of the irradiation position of the electron beam. In this manner, it is possible for the drawing system 1 to calculate the strength of the electric field on the surface of the resist according to electromagnetism without falling into a situation that makes calculation impossible due to the mathematically infinite strength of the electric field. Therefore, it is possible to accurately calculate the correction amount of the irradiation position of the electron beam on the surface of the resist R and to increase the positional accuracy of the pattern drawn on the mask substrate M.

(2) The drawing system 1 obtains the charge density distribution by adding the divided charge density map corresponding to the area to be calculated to the charge density distribution which is a previous calculation result, when the trajectory of the charged particle is calculated based on the charge density generated by the area having been subjected to electron beam irradiation. Accordingly, it is possible to increase the accuracy of calculation of the correction amount and to reduce the calculation load of the control unit 22.

(3) The drawing system 1 calculates the correction amount of the irradiation position appropriately according to the irradiation situation of the electron beam, and corrects the irradiation position by using different correction maps for the irradiation instances, respectively, for a case of applying the multi-path drawing to the mask substrate M and producing the charge density distribution according to the irradiation situation of the electron beam. In this manner, the drawing system 1 can increase the positional accuracy of the drawing pattern of each of the irradiation instances.

(4) It is possible for the drawing system 1 to calculate the correction amount of the electron beam by taking into consideration the situation where the drawing is performed overlapped in the plurality of irradiation instances and to increase the positional accuracy of the drawing pattern as a whole, even when only the single correction map is limitedly used in a case where the correction amount is calculated from the charge density distribution produced according to the irradiation situation and the calculated correction amounts of the irradiation instances are averaged and an average correction amount is used as the correction amount of each of the irradiation instances of the electron beam.

Heretofore, the embodiments of the invention have been described, but the invention is not limited to the above-described embodiments. Various modifications and changes such as modified examples described below are available, and these are included within the scope of the invention. In addition, the effects disclosed in the embodiments are merely the most appropriate effects obtained from the invention, but the effects of the invention are not limited to the disclosed in the embodiments. Furthermore, the above-described embodiments and the below-described modified examples may be used in an appropriate combined form. The detailed description thereof is omitted.

Modified Example (1) In the embodiment, the example where the electron beam is used as a charged particle beam is described, but the invention is not limited thereto. For example, an ion beam or the like may be used as a charged particle beam.

(2) In the embodiment, the example where the correction program is used for the case where the mask substrate M is irradiated with the electron beam is described, but the invention is not limited thereto. For example, the correction program may be used for the case where direct drawing is performed on a semiconductor wafer.

(3) In the embodiment, the example where the drawing system 1 produces correction amount data in advance and, after that, irradiates the electron beam is described. However, the drawing system may produce the correction amount data while irradiating the electron beam.

(4) In the embodiment, the example where the correction amount calculation device 20 provided to the drawing system 1 calculates the correction amount of the irradiation position of the electron beam is described, but the invention is not limited thereto. For example, the correction program may be stored in a storage unit of the electron beam irradiation device, and a control unit of the electron beam irradiation device may execute the correction program so as to correct the irradiation position of the electron beam.

EXPLANATION OF REFERENCE NUMERALS

1: drawing system
10: electron beam irradiation device
11: electron gun
12: XY stage
13: control unit
14: storage unit
15: deflector
20: correction amount calculation device
21: storage unit
22: control unit
M: mask substrate
R: resist

The invention claimed is:

1. A non-transitory storage medium storing a machine-readable program for correcting an irradiation position of a charged particle beam irradiated on a work piece applied with a resist, the storage medium including instructions configured to cause a controller to perform actions comprising:
replacing charging of the resist caused by irradiation of the charged particle beam with surface charges at an interface between the resist and the work piece and calculating a charge density distribution for each mesh of the replaced surface charges;
calculating a trajectory of a charged particle from an emission position of the charged particle beam to a surface of the resist based on the charge density distribution;
calculating an error amount of the irradiation position of the charged particle beam based on the calculated trajectory; and
calculating a correction amount of the irradiation position of the charged particle beam based on the calculated error amount.

2. The non-transitory storage medium according to claim 1, wherein
trajectory is calculated, in calculating the trajectory of a charged particle, based on only the charge density among the charge density distribution, the charge density being generated by an area where the charged particle beam irradiation is completed.

3. The non-transitory storage medium according to claim 2, wherein
in a case where the charged particle beam is irradiated on the resist a plurality of instances, a charge density distribution is produced, in calculating the charge density distribution, according to an irradiation situation of each of the instances.

4. The non-transitory storage medium according to claim 3, wherein
a trajectory corresponding to the irradiation situation of each of the instances is calculated, in calculating the trajectory of a charged particle, based on the charge density distribution associated with the irradiation situation, an error amount corresponding to the irradiation situation of each of the irradiation instances is calculated, in calculating the error amount, based on the trajectory associated with the irradiation situation, and a correction amount corresponding to the irradiation situation of each of the instances is calculated based on the error amount associated with the irradiation situation and the correction amount as a correction amount of the irradiation position of the charged particle beam of each of the instances is determined, in calculating the correction amount.

5. The non-transitory storage medium according to claim 3, wherein a trajectory corresponding to the irradiation situation is calculated, in calculating the trajectory of a charged particle, based on the charge density distribution associated with the irradiation situation, an error amount corresponding to the irradiation situation is calculated, in calculating the error amount, based on the trajectory associated with the irradiation situation, and a correction amount corresponding to the irradiation situation is calculated based on the error amount associated with the irradiation situation and an average value of calculated correction amounts as a correction amount of the irradiation position of the charged particle beam is determined, in calculating the correction amount.

6. A correction amount calculation device for an irradiation position of a charged particle beam comprising:

a controller; and a storage unit coupled to the controller, the storage unit storing a program for correcting the irradiation position of a charged particle beam irradiated on a work piece applied with a resist wherein the controller is configured to read the correction program from the storage unit and perform actions including:

replacing charging of the resist caused by irradiation of the charged particle beam with surface charges at an interface between the resist and the work piece and calculating a charge density distribution for each mesh of the replaced surface charges;

calculating a trajectory of a charged particle from an emission position of the charged particle beam to a surface of the resist based on the charge density distribution calculating an error amount of the irradiation position of the charged particle beam based on the calculated trajectory; and calculating a correction amount of the irradiation position of the charged particle beam based on the calculated error amount.

7. A charged particle beam irradiation system comprising:
the correction amount calculation device according to claim 6; and a charged particle beam irradiation device which irradiates the charged particle beam.

8. A method for correcting an irradiation position of a charged particle beam irradiated on a work piece applied with a resist, the method comprising:

replacing charging of the resist caused by irradiation of the charged particle beam with surface charges at an interface between the resist and the work piece and calculating a charge density distribution for each mesh of the replaced surface charges;

calculating a trajectory of a charged particle from an emission position of the charged particle beam to a surface of the resist based on the charge density distribution;

calculating an error amount of the irradiation position of the charged particle beam based on the calculated trajectory; and calculating a correction amount of the irradiation position of the charged particle beam based on the calculated error amount.

9. The non-transitory storage medium according to claim 1, wherein in a case where the charged particle beam is irradiated on the resist a plurality of instances, a charge density distribution is produced, in calculating the charge density distribution, according to an irradiation situation of each of the instances.

10. The non-transitory storage medium according to claim 9, wherein a trajectory corresponding to the irradiation situation of each of the instances is calculated, in calculating the trajectory of a charged particle, based on the charge density distribution associated with the irradiation situation, an error amount corresponding to the irradiation situation of each of the irradiation instances is calculated, in calculating the error amount, based on the trajectory associated with the irradiation situation, and a correction amount corresponding to the irradiation situation of each of the instances is calculated based on the error amount associated with the irradiation situation and the correction amount as a correction amount of the irradiation position of the charged particle beam of each of the instances is determined, in calculating the correction amount.

11. The non-transitory storage medium according to claim 9, wherein a trajectory corresponding to the irradiation situation is calculated, in calculating the trajectory of a charged particle, based on the charge density distribution associated with the irradiation situation, an error amount corresponding to the irradiation situation is calculated, in calculating the error amount, based on the trajectory associated with the irradiation situation, and a correction amount corresponding to the irradiation situation is calculated based on the error amount associated with the irradiation situation and an average value of calculated correction amounts as a correction amount of the irradiation position of the charged particle beam is determined, in calculating the correction amount.

12. The correction amount calculation device according to claim 6, wherein the trajectory is calculated, in calculating the trajectory of a charged particle, based on only the charge density among the charge density distribution, the charge density being generated by an area where the charged particle beam irradiation is completed.

13. The correction amount calculation device according to claim 12, wherein in a case where the charged particle beam is irradiated on the resist a plurality of instances, a charge density distribution is produced, in calculating the charge density distribution, according to an irradiation situation of each of the instances.

14. The correction amount calculation device according to claim 13, wherein
a trajectory corresponding to the irradiation situation of each of the instances is calculated, in calculating the trajectory of a charged particle, based on the charge density distribution associated with the irradiation situation,
an error amount corresponding to the irradiation situation of each of the irradiation instances is calculated, in calculating the error amount, based on the trajectory associated with the irradiation situation, and
a correction amount corresponding to the irradiation situation of each of the instances is calculated based on the error amount associated with the irradiation situation and the correction amount as a correction amount of the irradiation position of the charged particle beam of each of the instances is determined, in calculating the correction amount.

15. The correction amount calculation device according to claim 13, wherein
a trajectory corresponding to the irradiation situation is calculated, in calculating the trajectory of a charged particle, based on the charge density distribution associated with the irradiation situation,
an error amount corresponding to the irradiation situation is calculated, in calculating the error amount, based on the trajectory associated with the irradiation situation, and
a correction amount corresponding to the irradiation situation is calculated based on the error amount associated with the irradiation situation and an average value of calculated correction amounts as a correction amount of the irradiation position of the charged particle beam is determined, in calculating the correction amount.

16. The correction amount calculation device according to claim 6, wherein
in a case where the charged particle beam is irradiated on the resist a plurality of instances, a charge density distribution is produced, in calculating the charge density distribution, according to an irradiation situation of each of the instances.

17. The correction amount calculation device according to claim 16, wherein
a trajectory corresponding to the irradiation situation of each of the instances is calculated, in calculating the trajectory of a charged particle, based on the charge density distribution associated with the irradiation situation,
an error amount corresponding to the irradiation situation of each of the irradiation instances is calculated, in calculating the error amount, based on the trajectory associated with the irradiation situation, and
a correction amount corresponding to the irradiation situation of each of the instances is calculated based on the error amount associated with the irradiation situation and the correction amount as a correction amount of the irradiation position of the charged particle beam of each of the instances is determined, in calculating the correction amount.

18. The correction amount calculation device according to claim 16, wherein
a trajectory corresponding to the irradiation situation is calculated, in calculating the trajectory of a charged particle, based on the charge density distribution associated with the irradiation situation,
an error amount corresponding to the irradiation situation is calculated, in calculating the error amount, based on the trajectory associated with the irradiation situation, and
a correction amount corresponding to the irradiation situation is calculated based on the error amount associated with the irradiation situation and an average value of calculated correction amounts as a correction amount of the irradiation position of the charged particle beam is determined, in calculating the correction amount.

* * * * *